United States Patent [19]
Montgomery et al.

[11] Patent Number: 6,064,260
[45] Date of Patent: May 16, 2000

[54] RF AMPLIFIER NETWORK WITH A REDUNDANT POWER SUPPLY

[75] Inventors: Robert Keith Montgomery, Easton, Pa.; Emanuil Y. Shvarts, Somerville, N.J.

[73] Assignee: Lucent Technologies, Inc., Murray Hill, N.J.

[21] Appl. No.: 09/205,473

[22] Filed: Dec. 4, 1998

[51] Int. Cl.[7] ........................................................ H03F 3/68
[52] U.S. Cl. ...................... 330/127; 330/124 D; 330/127; 330/297
[58] Field of Search .................................. 330/51, 124 D, 330/127, 297

[56] References Cited

U.S. PATENT DOCUMENTS

| | | | |
|---|---|---|---|
| 4,079,333 | 3/1978 | Yamada | 330/297 |
| 5,276,917 | 1/1994 | Vanhanen et al. | 330/51 |

*Primary Examiner*—Michael B Shingleton
*Attorney, Agent, or Firm*—Darby & Darby

[57] ABSTRACT

An RF power amplifier network with a redundant power supply comprising a plurality of RF power amplifiers. Each RF power amplifier includes a power supply unit and an amplifier load. The power supply unit is adapted for receiving a primary input voltage Vin and producing a secondary output voltage Vout, and the power supply unit is further adapted for generating a power supply fail signal upon failure of the power supply unit. The network further includes a supply bus to which is connected each power supply unit of each RF power amplifier, and each amplifier load of each RF power amplifier. A switch associated with each of the power supply units is responsive to the fail signal for disconnecting the power supply unit from the bus in the event of failure of the power supply unit. A second switch is associated with each of the RF power amplifiers for disconnecting an amplifier load from the bus if the current drawn by the amplifier load exceeds a predetermined maximum threshold value or falls below a predetermined minimum threshold value.

6 Claims, 1 Drawing Sheet

RF AMPLIFIER NETWORK WITH A REDUNDANT POWER SUPPLY

BACKGROUND

The present invention relates generally to radio frequency (RF) transmitting stations, and more particularly, to an RF amplifier network in which a plurality of RF amplifiers are connected in a redundant net to increase the reliability of each amplifier in the net and the overall reliability of the base station.

Base stations used in cellular communication networks typically utilize a plurality of RF amplifiers for effecting transmissions. Because each RF amplifier has an independent power supply unit, failure of the power supply unit renders the RF amplifier associated with the failed unit inoperable. It would therefore be desirable to interconnect the RF amplifiers in such a way that failure of a power supply unit would not shut down the associated RF amplifier. Similarly, it would be beneficial if the RF amplifiers could be connected in such a manner that any amplifier in the network could be disconnected if the amplifier exhibited a failure mode indicated when the current drawn by that amplifier either falls below a predetermined minimum threshold value, or the current drawn by the unit exceeds a predetermined maximum threshold. In this manner, a failed amplifier could be replaced without disrupting the output of the overall system.

SUMMARY OF THE INVENTION

In view of the foregoing, it is an object of the present invention to provide an RF amplifier network with a redundant power supply.

It is a further object of the present invention to provide an RF amplifier network with a redundant power supply which generates excess power in the system to be distributed in the event of failure of any power supply unit(s) in the network.

It is yet another object of the present invention to provide an RF amplifier network with a redundant power supply in which a failed power supply unit can be disconnected from the system while still enabling operation of each RF amplifier in the network on the remaining operable power supply units.

It is another object of the present invention to provide an RF amplifier network with a redundant power supply in which any amplifier may be disconnected from the network if the current drawn by that unit either falls below a predetermined minimum threshold value or exceeds a predetermined maximum threshold value.

It is still another object of the present invention to provide an RF amplifier network with a redundant power supply which permits the individual power supply units in the system to be made smaller and more efficient where redundancy is not a requirement.

In accordance with the foregoing objects and additional objects that will become apparent hereinafter, the present invention provides an RF power amplifier network with a redundant power supply comprising a plurality of RF power amplifiers. Each RF power amplifier includes a power supply unit and an amplifier load. The power supply unit is adapted for receiving a primary input voltage Vin and producing a secondary output voltage Vout, and the power supply unit is further adapted for generating a power supply fail signal upon failure of the power supply unit. The network further includes a supply bus to which is connected each power supply unit of each RF power amplifier, and each amplifier load of each RF power amplifier. A switch associated with each of the power supply units is responsive to the fail signal for disconnecting the power supply unit from the bus in the event of failure of the power supply unit. A second switch is associated with each of the RF power amplifiers for disconnecting an amplifier load from the bus if the current drawn by the amplifier load exceeds a predetermined maximum threshold value or falls below a predetermined minimum threshold value.

The invention also provides a power amplifier for use in the above network, comprising a power supply unit and an amplifier load. The power supply unit is adapted for receiving a primary input voltage Vin and producing a secondary output voltage Vout, and the power supply unit is further adapted for generating a power supply fail signal upon failure of the power supply unit. A switch is associated with the power supply unit responsive to the fail signal for disconnecting the power supply unit from the bus in the event of failure of the power supply unit. A second switch is provided for disconnecting the amplifier load from the bus if the current drawn by the amplifier load exceeds a predetermined maximum threshold value or falls below a predetermined minimum threshold value.

BRIEF DESCRIPTION OF THE DRAWINGS

In accordance with the above, the present invention will now be described in detail with particular reference to the accompanying drawing.

DETAILED DESCRIPTION OF THE PREFERRED EMBODIMENTS

Figure 1:
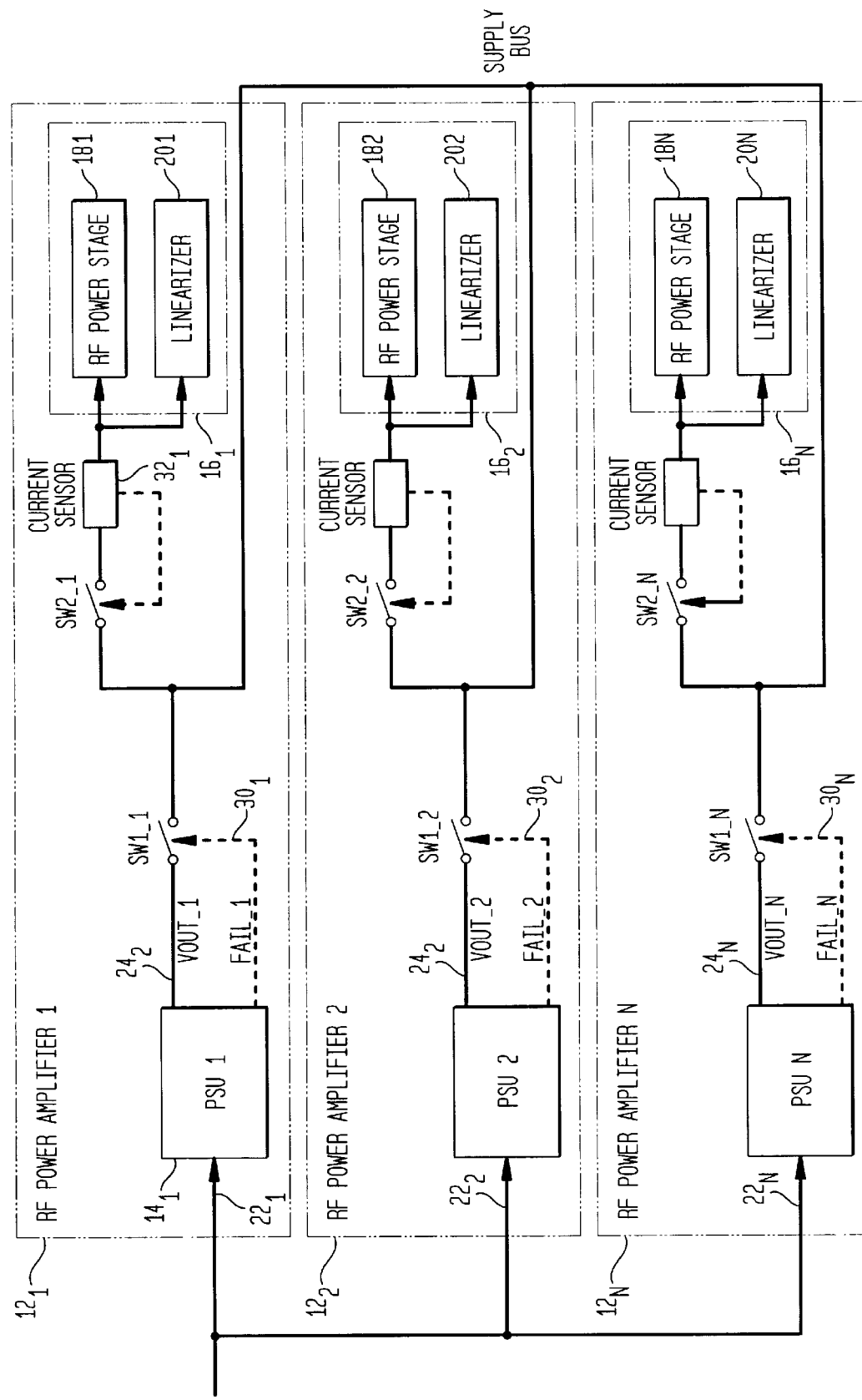
FIG. 1 is a schematic block diagram of the invention in the illustrative embodiment.

Referring now to the schematic block diagram of FIG. 1, there is shown an RF power amplifier network ("RF Net") generally characterized by the reference numeral 10. RF Net 10 is typically part of a base station used for transmitting cellular signals for cellular communications or any other application which requires significant RF transmitting power. The base station arrangement is known in the art and therefore will not be described in detail herein.

RF Net 10 includes a plurality "N" of RF power amplifiers $12_1, 12_2, \ldots 12_N$. Each power amplifier 12 includes a power supply unit 14 and an amplifier load 16. The amplifier load 16 comprises an RF power stage 18 and a linearizer 20 as is known in the art. Each power supply unit 14 has an input 22 which receives a primary input voltage Vin. A secondary output voltage Vout is produced through output 24. This secondary output voltage Vout is supplied to a common BUS 26 through a first set of switches SW1_1, SW1_2, . . . SW1_N. The power supply unit 14 is adapted to generate a FAIL signal output indicating failure of the specific power supply unit 14. The FAIL signal is applied on line 30 to cause the respective SW1 to disconnect the failed power supply unit 14 from BUS 26.

The RF amplifier load 16 is connected to BUS 26 through a second set of switches SW2_1, SW2_2, . . . SW2_N. The second switch SW2 is responsive to a respective current sensor 32 adapted to sense the current being drawn by the load 16. If the current drawn by any one load 16 exceeds a predetermined threshold, or if the current drops below a predetermined threshold, the current sensor 32 disconnects that load 16 from the BUS 26. That amplifier 12 will now be disconnected from the RF Net 10.

In normal operation, all switches SW1_1 . . . SW1_N, and SW2_1 . . . SW2_N, are closed. Every voltage supply unit 14 provides power Vout to BUS 26 through the respective switch SW1, and each RF amplifier load 16 (RF power stage 18 and linearizer 20) draws current from BUS 26 through the respective switch SW2. Each amplifier load 16 requires an average power value represented by Pav, and peak power during transient periods represented by Pmax. If one of the power supply units 14 in the RF Net 10 can deliver Pmax, the RF Net 10 has excess power represented by the following relationship:

$$\sigma P = N \cdot (Pmax - Pav)$$

By way of example, where N=6 (an RF Net 10 having six RF power amplifiers $12_1 \ldots 12_6$), Pmax=600W and Pav=450W, the excess power σP=900W. This excess power provides several advantages. If the power requirement for any or several of the amplifiers in the RF Net 10 increases, there is enough excess power in the system to handle the higher load. If a power supply unit 14 should fail and be taken off line by opening the associated switch SW2 in accordance with the above, the excess power in the system can be used to drive the associated amplifier load 16 without interruption. In this manner there is a distributed redundancy throughout the RF Net 10. Alternatively, the excess power can be employed to reduce the overall size and cost of the individual power supply units 14 if redundancy is not the primary objective.

If a single power supply unit 14 should fail, a FAIL signal in the corresponding line 30 causes the respective switch SW1 to open and disconnect that power supply unit 14 from BUS 26 and the RF Net 10. The excess power σP is always greater than the average power required Pav, thereby enabling all of the amplifiers in the RF Net 10 to continue operation.

If the current consumed by any one amplifier load 16 exceeds a predetermined threshold or drops below a predetermined threshold as sensed by the associated current sensor 32, the corresponding switch SW2 is opened to disconnect that amplifier load 16 from BUS 26. This removes the amplifier load 16 in that RF power amplifier 12 from the rest of the system.

The present invention has been shown and described in what are considered to be the most practical and preferred embodiments. It is anticipated, however, that departures can be made therefrom and that obvious modifications will be implemented by persons skilled in the art.

We claim:

1. An RF power amplifier network with a redundant power supply, comprising:

a plurality of RF power amplifiers, each RF power amplifier including a power supply unit and an amplifier load, each power supply unit adapted for receiving a primary input voltage Vin and producing a secondary output voltage Vout, said power supply unit further adapted to generate a power supply fail signal upon failure of said power supply unit;

a supply bus to which is connected each power supply unit of each RF power amplifier, and each amplifier load of each RF power amplifier; and switch means associated with each of said power supply units responsive to said fail signal for disconnecting the power supply unit from said bus in the event of failure of the power supply unit.

2. The RF power amplifier network recited in claim 1, further comprising second switch means associated with each of said RF power amplifiers for disconnecting an amplifier load from said bus if the current drawn by said amplifier load exceeds a predetermined maximum threshold or falls below a predetermined minimum threshold.

3. The RF power amplifier network recited in claim 2, wherein said second switch means is responsive to a current sensor.

4. The RF power amplifier network recited in claim 1, wherein each RF power amplifier includes an RF power stage and a linearizer.

5. An RF power amplifier network with a redundant power supply, comprising:

a plurality of RF power amplifiers, each RF power amplifier including a power supply unit and an amplifier load, each power supply unit adapted for receiving a primary input voltage Vin and producing a secondary output voltage Vout, said power supply unit further adapted for generating a power supply fail signal upon failure of said power supply unit;

a supply bus to which is connected each power supply unit of each RF power amplifier, and each amplifier load of each RF power amplifier;

switch means associated with each of said power supply units responsive to said fail signal for disconnecting the power supply unit from said bus in the event of failure of the power supply unit;

second switch means associated with each of said RF power amplifiers for disconnecting an amplifier load from said bus if the current drawn by said amplifier load exceeds a predetermined maximum threshold or falls below a predetermined minimum threshold.

6. In an RF power amplifier network with a redundant power supply connected to a common supply bus, a power amplifier, comprising:

a power supply unit and an amplifier load, said power supply unit adapted for receiving a primary input voltage Vin and producing a secondary output voltage Vout, said power supply unit further adapted for generating a power supply Fail signal upon failure of said power supply unit;

switch means associated with said power supply unit responsive to said fail signal for disconnecting said power supply unit from said bus in the event of failure of said power supply unit; and switch means associated with said power supply unit responsive to said fail signal for disconnecting said power supply unit from said bus in the event of failure of said power supply unit; and second switch means for disconnecting said amplifier load from said bus if the current drawn by said amplifier load exceeds a predetermined maximum threshold or falls below a predetermined minimum threshold.

* * * * *